United States Patent
Nakagawa et al.

(10) Patent No.: US 10,268,227 B2
(45) Date of Patent: Apr. 23, 2019

(54) TRANSMISSION APPARATUS, TRANSMISSION SYSTEM AND DATA DETECTION METHOD

(71) Applicant: FUJITSU LIMITED, Kawasaki-shi, Kanagawa (JP)

(72) Inventors: Goji Nakagawa, Sagamihara (JP); Setsuo Yoshida, Inagi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/670,611

(22) Filed: Aug. 7, 2017

(65) Prior Publication Data

US 2018/0074539 A1 Mar. 15, 2018

(30) Foreign Application Priority Data

Sep. 13, 2016 (JP) .................................. 2016-178927

(51) Int. Cl.

| G05F 3/26 | (2006.01) |
|---|---|
| H04B 10/61 | (2013.01) |
| H04B 10/077 | (2013.01) |
| H04J 14/02 | (2006.01) |
| G02B 6/12 | (2006.01) |

(52) U.S. Cl.
CPC ............ *G05F 3/26* (2013.01); *H04B 10/077* (2013.01); *H04B 10/614* (2013.01); *H04J 14/0227* (2013.01); *H04J 14/0282* (2013.01); *G02B 2006/1215* (2013.01); *H03F 2200/258* (2013.01); *H03F 2200/432* (2013.01)

(58) Field of Classification Search
CPC ....... G05F 3/26; H04B 10/614; H04B 10/077; H03F 2200/432; H03F 2200/258; G02B 2006/1215; H04J 14/027; H04J 14/0282
See application file for complete search history.

(56) References Cited

U.S. PATENT DOCUMENTS

| 2003/0202805 A1* | 10/2003 | Taga | H04B 10/695 |
| | | | 398/202 |
| 2003/0215176 A1* | 11/2003 | Britz | G02B 6/2938 |
| | | | 385/24 |
| 2004/0184819 A1* | 9/2004 | Vassilieva | H04B 10/505 |
| | | | 398/188 |
| 2013/0336650 A1* | 12/2013 | Azadeh | H04B 10/40 |
| | | | 398/38 |

FOREIGN PATENT DOCUMENTS

JP   H05-244046 A   9/1993

* cited by examiner

*Primary Examiner* — Syed Haider
(74) *Attorney, Agent, or Firm* — Fujitsu Patent Center (57) ABSTRACT

A transmission apparatus including: a branch circuit that branches a signal including first data and second data superimposed on the first data into two signals; a limiting amplifier that amplifies one signal in the two signals; a linear amplifier that amplifies another signal in the two signals; a first detector that detects the first data from the amplified one signal; and a second detector that detects the second data from the amplified another signal and the amplified one signal.

12 Claims, 7 Drawing Sheets

TRANSMISSION APPARATUS, TRANSMISSION SYSTEM AND DATA DETECTION METHOD

CROSS-REFERENCE TO RELATED APPLICATION

This application is based upon and claims the benefit of priority of the prior Japanese Patent Application No. 2016-178927, filed on Sep. 13, 2016, the entire contents of which are incorporated herein by reference.

FIELD

A certain aspect of embodiments described herein relates to a transmission apparatus, a transmission system and a data detection method.

BACKGROUND

With the popularization of wireless communication terminals such as smartphones, traffics between a wireless base station and a housing stations increase. Therefore, the application of the transmission technology of DWDM (Dense Wavelength Divisional Multiplexing) to a metro-access system network is considered. In such a network, a transmission device of a central side (backbone side) and a plurality of transmission devices of an end-user side are connected to each other via an AWG (Arrayed Waveguide Grating) that demultiplexes optical signals with multiple wavelengths, and configures a star type network such as a PON (Passive Optical Network). In the following, the transmission device of the central side is referred to as a "central side device", and the transmission device of the end-user side is referred to as a "user side device".

The user side device can transmits the optical signal with a different wavelength for each user side device, and a wavelength variable light source is provided in each user side device so that a versatility between the respective user side devices is ensured. The central side device superimposes control data for a wavelength setting on a main signal to be transmitted to each subscriber device in order to set a wavelength of the wavelength variable light source for each user side device. Regarding the superposition of the signal, for example, Patent Document 1 (i.e., Japanese Laid-open Patent Publication No. 5-244046) discloses superimposing monitoring data on the optical signal.

SUMMARY

According to an aspect of the present invention, there is provided a transmission apparatus including: a branch circuit that branches a signal including first data and second data superimposed on the first data into two signals; a limiting amplifier that amplifies one signal in the two signals; a linear amplifier that amplifies another signal in the two signals; a first detector that detects the first data from the amplified one signal, and a second detector that detects the second data from the amplified another signal and the amplified one signal.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

According to the technique described in the Patent Document 1, in the main signal on which the monitoring data is superimposed, an amplitude of a pulse increases by the monitoring signal, and hence an eye pattern deteriorates. Therefore, an error might occur when the data of the main signal is detected.

Figure 1:
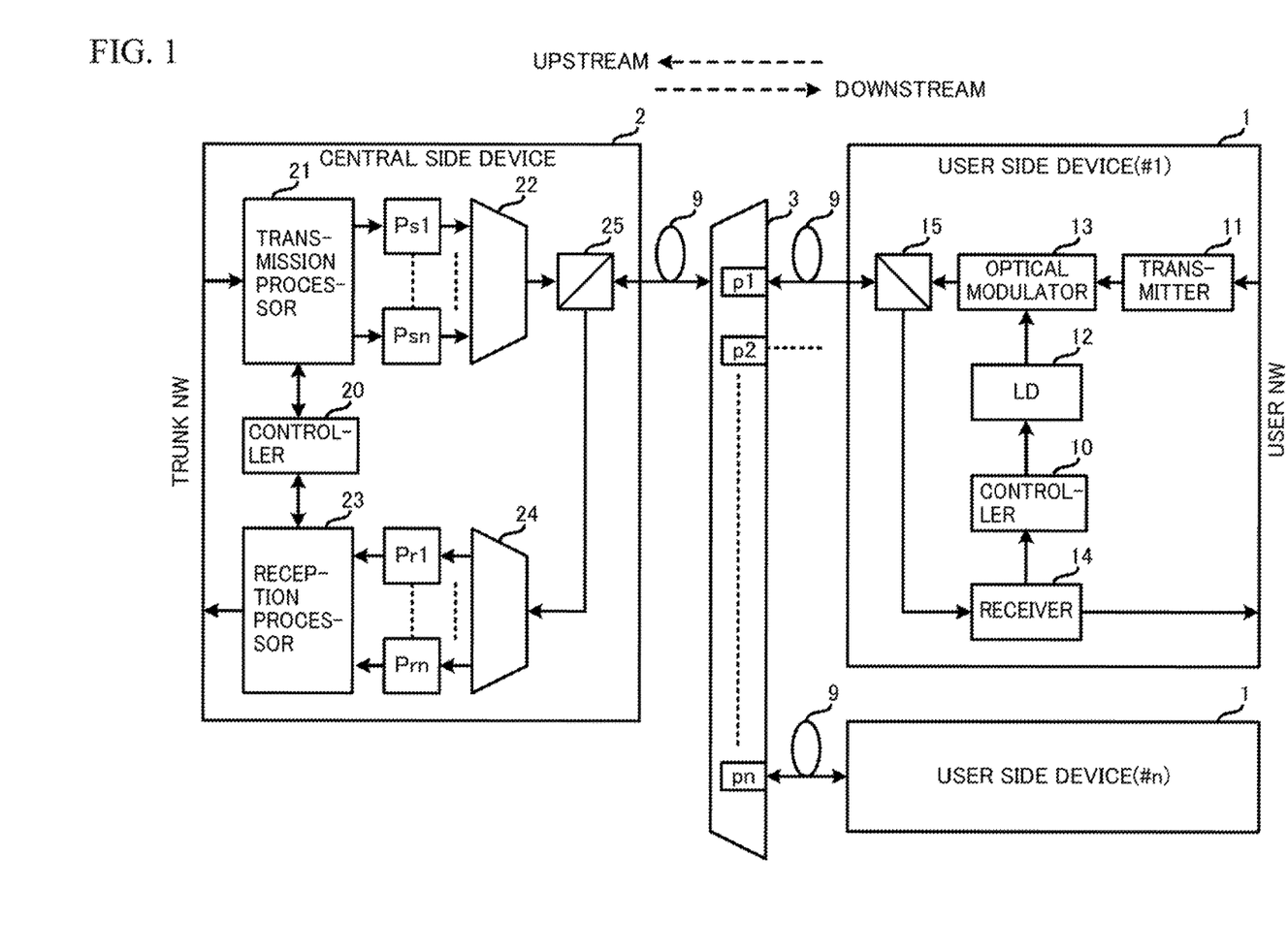
FIG. 1 is a configuration diagram illustrating an example of a transmission system.

FIG. 1 is a configuration diagram illustrating an example of a transmission system. The transmission system includes a central side device 2, n (n represents an integer of 1 or more) user side device (#1 to #n) 1, and an optical demultiplexer 3. The central side device 2 and each user side device 1 are connected to each other via a transmission path 9 made of an optical fiber, and via the optical demultiplexer 3 connected to the middle of the transmission path 9. Here, the central side device 2 is an example of a first transmission apparatus. The user side device 1 is a transmission apparatus according to the embodiment, and is an example of a second transmission apparatus.

The central side device 2 is connected to an upstream trunk network (trunk NW) for example, transmits a signal received from the trunk network to the user side device 1, and transmits a signal received from the user side device 1 to the trunk network. The user side device 1 is connected to a downstream user network (user NW) for example, transmits a signal received from the user network to the central side device 2, and transmits a signal received from the central side device 2 to the user network.

The central side device 2 includes a controller 20, a transmission processor 21, n transmission ports Ps1 to Psn, an AWG 22, a reception processor 23, n reception ports Pr1 to Prn, an AWG 24, and a WDM coupler 25. The controller 20 is composed of, for example, a CPU (Central Processing Unit) circuit, and controls the transmission processor 21 and the reception processor 23.

The transmission processor 21 is composed of, for example, a logic circuit such as a FPGA (Field Programmable Gate Array), and outputs the signal received from the trunk network to any one of the transmission ports Ps1 to Psn corresponding to the destination of the signal. A corresponding relationship between the destination and the transmission ports Ps1 to Psn is registered in a memory inside the transmission processor 21 from the controller 20.

Each of the transmission ports Ps1 to Psn outputs a signal addressed to the user side device (#1 to #n) 1 to the AWG 22. The transmission ports Ps1 to Psn include LDs (Laser Diode) that output light with different wavelengths each other, and optical modulators that optically modulate the light output from the LDs based on the signal from the transmission processor 21. Therefore, the signal is converted into an optical signal from an electric signal by the transmission ports Ps1 to Psn, and the optical signal is output to the AWG 22.

The AWG 22 performs wavelength multiplexing of the signal input from each of the transmission ports Ps1 to Psn to make a wavelength multiplex optical signal, and outputs the wavelength multiplex optical signal to the WDM coupler 25. The WDM coupler 25 leads the wavelength multiplex optical signal input from the AWG 22 to the transmission path 9, and leads the wavelength multiplex optical signal input from the user side device 1 through the transmission path 9 to the AWG 24.

Here, for example, a L (Long) band defined by ITU-T (International Telecommunication Union Telecommunication Standardization sector) is used for the wavelength of each signal flowing in the downstream toward each user side device 1 from the central side device 2. On the other hand, a C (Conventional) band defined by the ITU-T is used for the wavelength of each signal flowing in the upstream toward the central side device 2 from each user side device 1.

The AWG 24 demultiplexes the wavelength multiplex optical signal input from the WDM coupler 25 into optical signals of respective wavelengths, and outputs the optical signals to the reception ports Pr1 to Prn corresponding to the respective wavelengths. The reception ports Pr1 to Prn receive the optical signals with different wavelengths each other. Each of the reception ports Pr1 to Prn includes, for example, a PD (Photo Detector), converts the optical signal into the electric signal and outputs the electric signal to the reception processor 23. The reception processor 23 is comprised of, for example, a logic circuit such as the FPGA, and outputs the signals input from the reception ports Pr1 to Prn to the trunk network.

The optical demultiplexer 3 is composed of the AWG, for example, and includes ports p1 to pn connected to the user side devices (#1 to #n) 1, respectively. The optical demultiplexer 3 multiplexes the optical signals input to the ports p1 to pn from the respective user side devices 1 to make a wavelength multiplex optical signal flowing in the upstream, and outputs the wavelength multiplex optical signal to the central side device 2. Moreover, the optical demultiplexer 3 demultiplexes the wavelength multiplex optical signal flowing in the downstream input from the central side device 2 into the optical signals of the respective wavelengths, and transmits the optical signals from the ports corresponding to the respective wavelengths to the respective user side devices 1.

The user side device 1 includes a controller 10, a transmitter 11, a laser diode (LD) 12, an optical modulator 13, a receiver 14 and a WDM coupler 15. The transmitter 11 is composed of, for example, a logic circuit such as the FPGA, and outputs the signal received from the user network to the optical modulator 13. In the LD 12, the wavelength of the output light is variable (i.e., a wavelength variable light source), and the LD 12 outputs the light with the wavelength set from the controller t0, to the optical modulator 13. The optical modulator 13 generates the optical signal by modulating the light input from the LD 12 based on the signal input from the transmitter 11, and outputs the optical signal to the WDM coupler 15.

The WDM coupler 15 leads the optical signal input from the optical modulator 13 to the transmission path 9, and leads the optical signal input from the central side device 2 through the transmission path 9 to the receiver 14. The receiver 14 receives the optical signal from the central side device 2. Here, the configuration of the receiver 14 is described later.

Since the wavelength multiplexing is performed on the signals flowing in the upstream transmitted from the respective user side devices 1 by the optical demultiplexer 3, the wavelength is different for each user side device 1. For this reason, the central side device 2 superimposes a control signal for wavelength setting on the main signal flowing in the downstream and outputs the superimposed signal to the user side device 1 so that a given wavelength is set to the LD 12 of each user side device 1. The transmission rate of the control signal is lower than that of the main signal. For example, the main signal is transmitted at 10 (Gbps), and the control signal is transmitted at 100 (Kbps). For example, an Ethernet frame is considered as a format of the main signal and the control signal, but the format is not limited to this.

More specifically, main signal data input from the trunk network and control data for wavelength setting superimposed on the main signal data are included in the signal flowing in the downstream. The main signal data is an example of first data, and the control data is an example of second data. In the central side device 2, the controller 20 generates the control data for wavelength setting as the superimposed signal for the main signal, and outputs the control data to the transmission processor 21. The transmission processor 21 generates the signal by superimposing the control data on the main signal data received from the trunk network, and transmits the signal from each of the transmission ports Ps1 to Psn.

In this case, the transmission processor 21 superimposes the control data on the main signal data by increasing an amplitude of a pulse of the signal flowing in the downstream. For this reason, in a domain where the control data is superimposed on the main signal data, the amplitude of the pulse of the signal flowing in the downstream is larger by the control data than that of the pulse of the signal in a non-superimposed domain.

In each user side device 1, the receiver 14 detects the main signal data and the control data from the signal flowing in the downstream. The receiver 14 generates a signal from the main signal data and transmit the signal to the user network, and outputs the control data to the controller 10. The controller 10 is composed of, for example, a CPU circuit, and sets the wavelength of the output light to the LD 12 based on the control data. Hereinafter, the configuration of the receiver 14 is described later.

Figure 2:
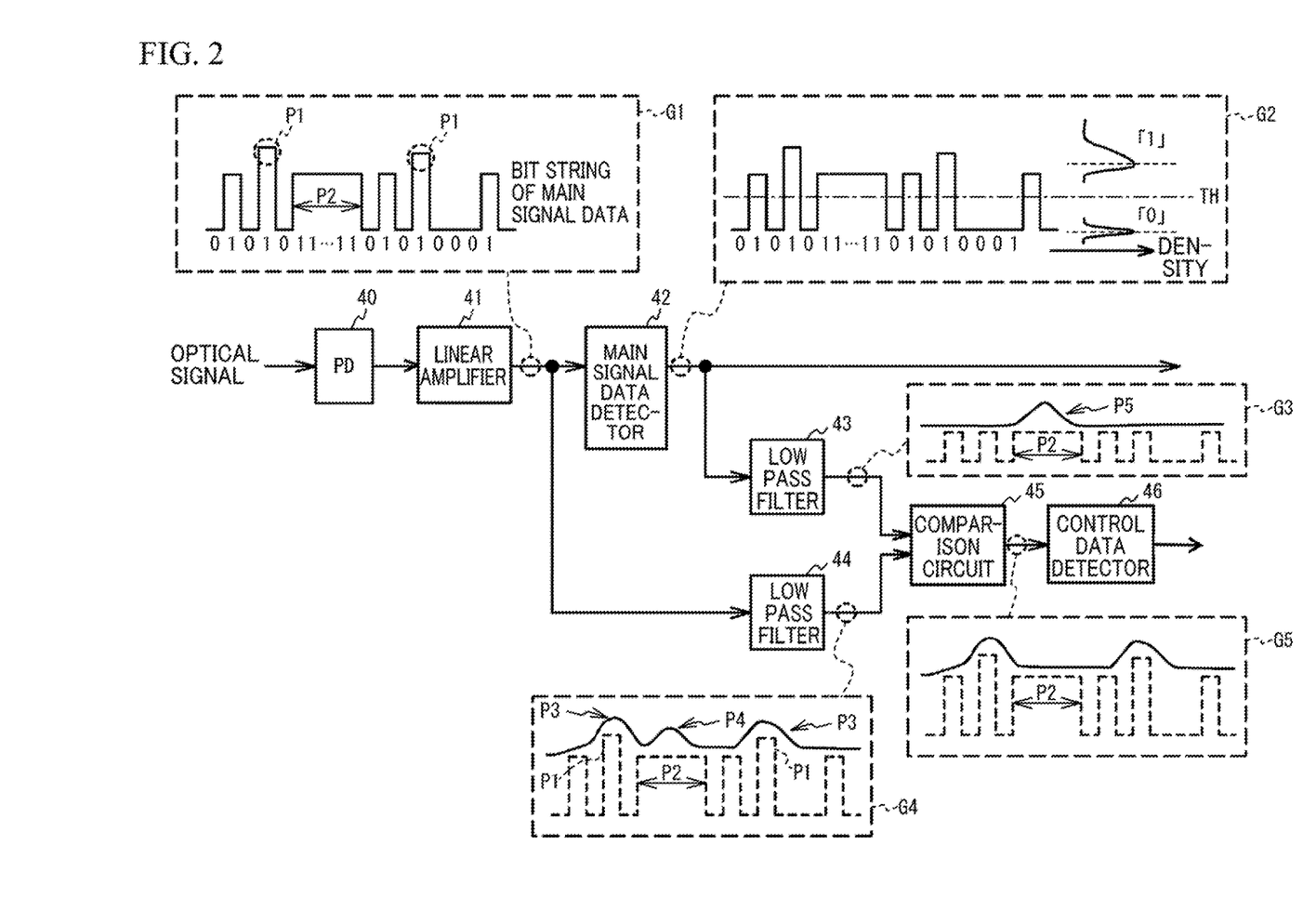
FIG. 2 is a configuration diagram illustrating a receiver according to a comparative example.

FIG. 2 is a configuration diagram illustrating the receiver 14 according to a comparative example. In FIG. 2, each of codes G1 to G5 illustrates an example of a signal waveform of each part in the receiver 14. The receiver 14 includes a PD 40, a linear amplifier 41, a main signal data detector 42, low pass filters 43 and 44, a comparison circuit 45 and a control data detector 46.

The PD 40 converts the optical signal flowing in the downstream input from the WDM coupler 15 into the electric signal and outputs the electric signal to the linear amplifier 41 as a data signal. The linear amplifier 41 amplifies the data signal according to a linear amplification characteristic. The data signal is an example of a signal, is transmitted to paths branched into two, and is input to the main signal data detector 42 and the low pass filter 44.

The code G1 illustrates an example of the waveform of the data signal output from the linear amplifier 41 to the main signal data detector 42 and the low pass filter 44. The data signal is a digital signal, and a bit string indicating a value "0" or "1" (binary number) of the main signal data. As illustrated by a code P1, the control data is superimposed on a part of the bit string. The amplitude of the pulse of the part on which the control data is superimposed is larger than that of the pulse of another part. Here, a code P2 illustrates a domain with a high bit density where a large number of data values "1" are continuous.

The main signal data detector 42 is composed of, for example, a logic circuit such as the FPGA, and detects the main signal data from the data signal by comparing a level of the data signal with a given threshold value TH. More specifically, the main signal data detector 42 determines that a data value of a part where a voltage of the data signal is equal to or more than the threshold value TH is "L", and that a data value of another part where the voltage of the data signal is less than the threshold value TH is "0". The threshold value TH is decided based on an eye pattern of the ideal data signal, for example.

Figure 3:
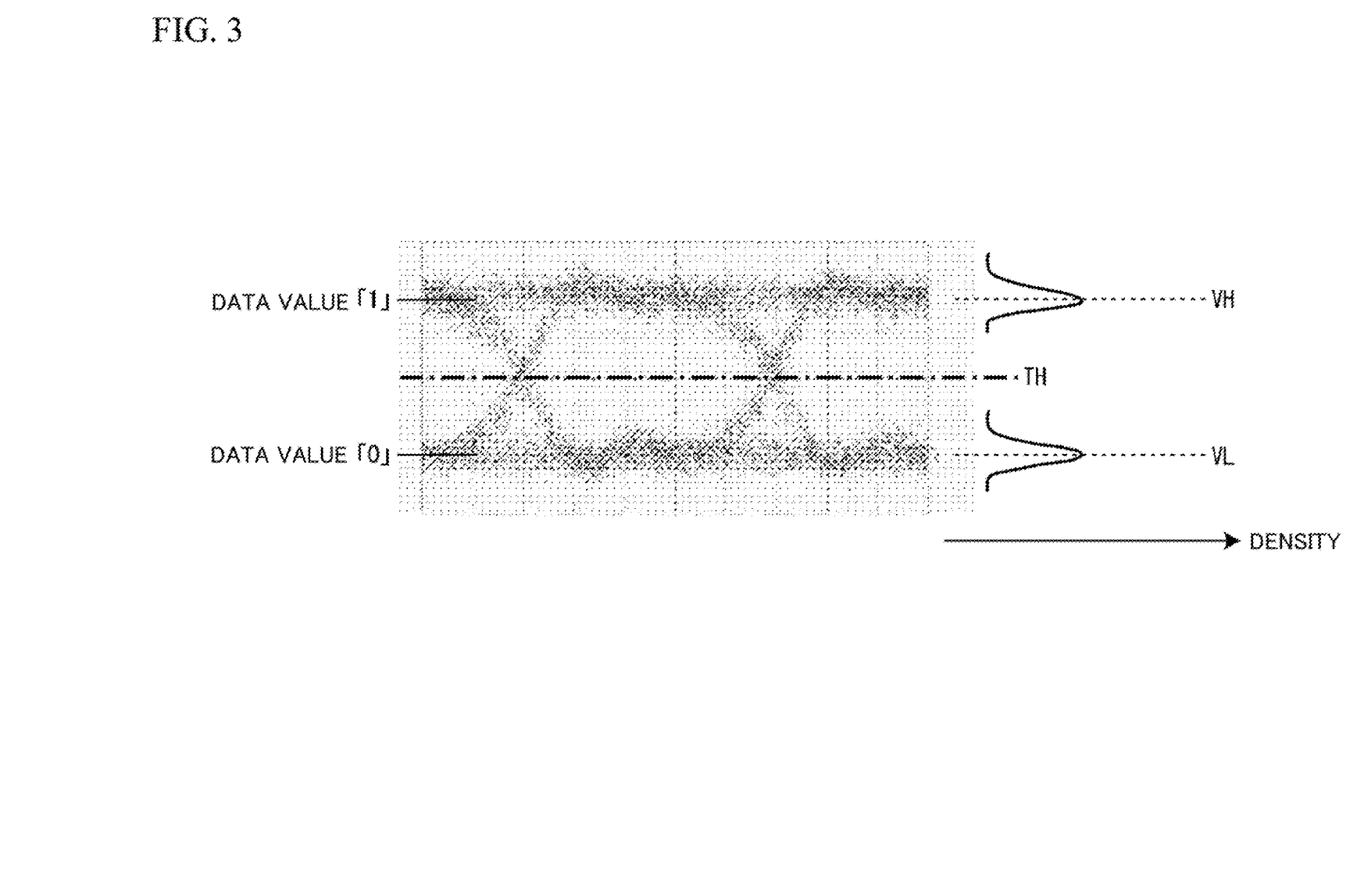
FIG. 3 is a diagram illustrating an example of an eye pattern of an ideal data signal.

FIG. 3 is a diagram illustrating an example of the eye pattern of the ideal data signal. The eye pattern is a waveform obtained by sampling the voltage of the data signal, and is an index indicating the quality of the data signal.

The threshold value TH is determined based on density distributions of the voltages of the data values "0" and "1". More specifically, a center value of the voltages VH and VL corresponding to the highest densities of the data values "0" and "1" is determined as the threshold value TH, for example. For this reason, the more the density distributions of the voltages of the data values "0" and "1" spread, the more the eye pattern deteriorates, and hence the data error increases.

Referring to FIG. 2 again, the code G2 illustrates an example of a determination state of the data value based on the threshold value TH by the main signal data detector 42. Since the control data is included in the data signal input from the linear amplifier 41 to the main signal data detector 42, the density distribution of the data value "1" is wider than that of the case of the above-mentioned ideal data signal. For this reason, the eye pattern of the data signal deteriorates and the data error can occur in the main signal data detector 42. The data signal output from the main signal data detector 42 is inputted to a non-illustrated subsequent processor and the low pass filter 43.

Moreover, the low pass filter 44 filters the data signal input from the linear amplifier 41. The low pass filter 44 smooths the data signal and outputs the smoothed data signal to the comparison circuit 45.

The code G4 illustrates an example of a waveform of the data signal output from the low pass filter 44 to the comparison circuit 45. A dotted line illustrates a waveform of the data signal before filtering by the low pass filter 44.

The domain (see the code P1) of the data signal on which the control data is superimposed is a mountain-type waveform by the filtering, as indicated by a code P3. Due to inter-code interference, the domain (see the code P2) of the data signal with the high bit density is a mountain-type waveform by the filtering despite the lack of the control data, as indicated by a code P4.

The comparison circuit 45 removes a mountain-type waveform portion by the comparison with the waveform of the data signal input from the low pass filter 43. The low pass filter 43 filters the data signal input from the main signal data detector 42. The low pass filter 43 smooths the data signal and outputs the smoothed data signal to the comparison circuit 45.

The code G3 illustrates an example of a waveform of the data signal output from the low pass filter 43 to the comparison circuit 45. A dotted line illustrates a waveform of the data signal before filtering by the low pass filter 43, i.e., the waveform of the data signal after the determination of the data value.

Since the main signal data detector 42 outputs the data signal after the determination of the data value, the control data is not included in an output waveform of the data signal. However, as described above, due to the inter-code interference, the domain (see the code P2) of the data signal with the high bit density is the mountain-type waveform by the filtering, as indicated by a code P5.

The comparison circuit 45 compares the waveform of the data signal input from the low pass filter 44 with the waveform of the data signal input from the low pass filter 43. More specifically, the comparison circuit 45 compares the waveform of the code G4 with the waveform of the code G3, and detects and removes a common mountain-type waveform domain represented by the codes P4 and P5. Thereby, it is possible to normally detect the control data. The comparison circuit 45 outputs the data signal generated as a comparison result to the control data detector 46.

The code G5 illustrates an example of the waveform of the data signal output from the comparison circuit 45 to the control data detector 46. A dotted line illustrates a waveform of the data signal illustrated by the code G1. As can be understood as compared with the waveform of the code G4, the mountain-type waveform domain P4 is removed from the data signal by the comparison processing of the comparison circuit 45.

The control data detector 46 is composed of, for example, a logic circuit such as the FPGA, and detects the control data from the data signal. The control data detector 46 detects the control data by detecting the mountain-type waveform domain from the waveform indicated by the code G5, for example. The control data detector 46 outputs the control data to the controller 10.

As described above, the main signal data detector 42 detects the main signal data on which the control data is superimposed, and therefore the eye pattern of the data signal deteriorates and the data error may occur. Therefore, as described later, the receiver 14 of the present embodiment amplifies the data signal with the use of a limiting amplifier before the detection of the main signal data and removes the control data from the amplified data signal, which prevents the deterioration of the eye pattern and reduces the data error.

Figure 4:
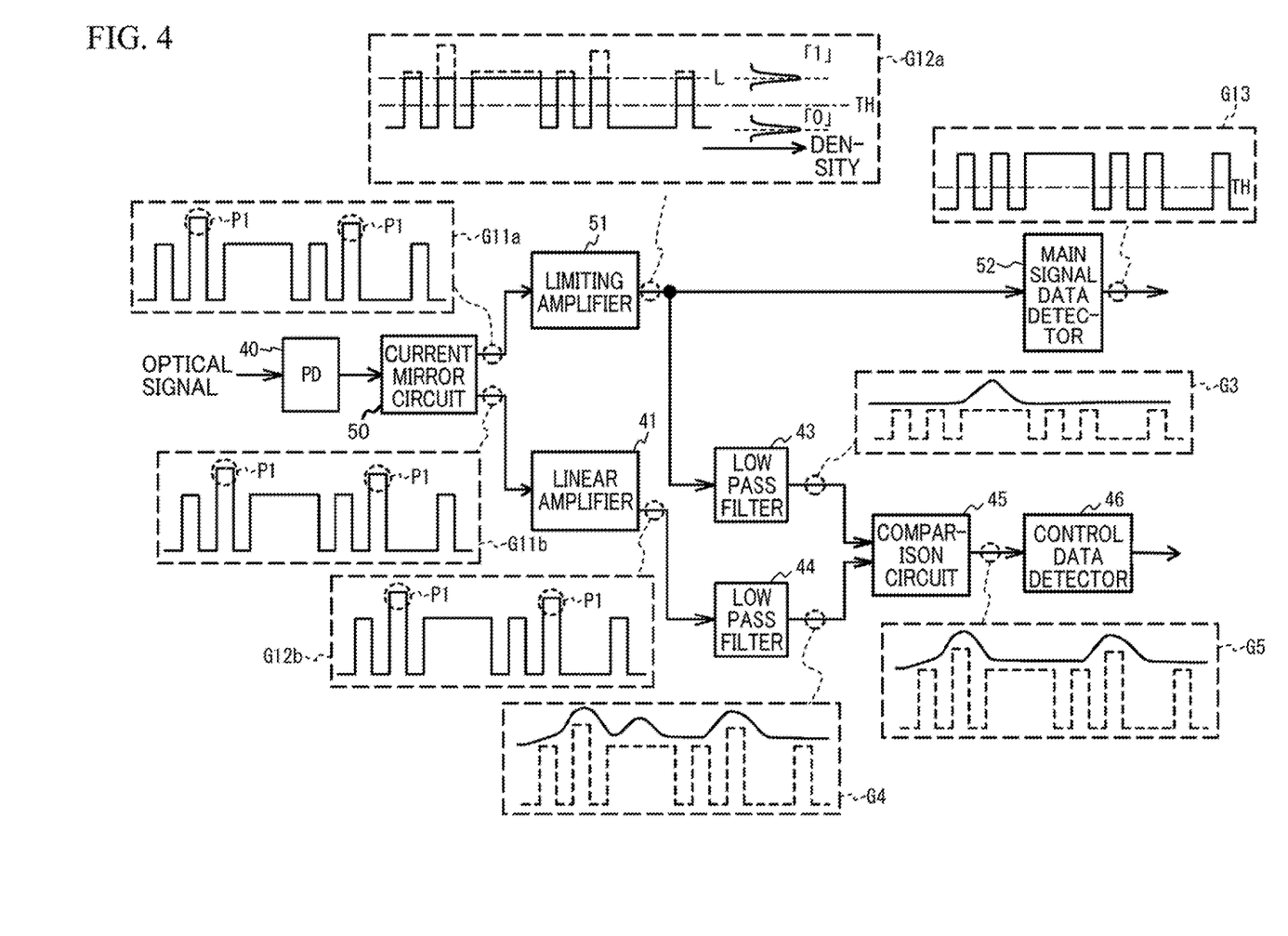
FIG. 4 is a configuration diagram illustrating a receiver according to an embodiment.

FIG. 4 is a configuration diagram illustrating the receiver 14 according to the present embodiment. In FIG. 4, elements common to those in FIG. 2 are designated by the same reference numbers, and description thereof is omitted. In FIG. 4, codes G11a, G11b, G12a, G12b, G13 and G3 to G5 illustrate examples of the signal waveforms in the respective elements in the receiver 14.

The receiver 14 includes the PD 40, a current mirror circuit 50, the linear amplifier 41, a limiting amplifier 51, a main signal data detector 52, the low pass filters 43 and 44, the comparison circuit 45 and the control data detector 46. The current mirror circuit 50 is an example of a branch circuit, and branches the data signal input from the PD 40. Here, the branch circuit of the data signal is not limited to the current mirror circuit 50, and another branch circuit such as an electric splitter may be used.

The current mirror circuit 50 copies the data signal and outputs the data signal to the limiting amplifier 51 and the linear amplifier 41. The code G11a illustrates the waveform of the data signal input from the current mirror circuit 50 to the limiting amplifier 51. The code G11b illustrates the waveform of the data signal input from the current mirror circuit 50 to the linear amplifier 41.

The data signal with the same waveform is input to the limiting amplifier 51 and the linear amplifier 41. The limiting amplifier 51 amplifies one of the data signals branched by the current mirror circuit 50, and the linear amplifier 41 amplifies another one of the data signals branched by the current mirror circuit 50. The data signal output from the limiting amplifier 51 is used for the detection of the main signal data, and the data signal output from the linear amplifier 41 is used for the detection of the control data. Here, the current mirror circuit 50 has no limitation of a branch ratio of the data signals to the limiting amplifier 51 and the linear amplifier 41.

The limiting amplifier 51 amplifies the data signal within a range not exceeding a predetermined upper limit. That is, the limiting amplifier 51 amplifies the data signal, and removes components in which an amplified level exceeds the upper limit value, from the data signal. Therefore, when the upper limit value is set to an appropriate value, the limiting amplifier 51 can remove the control data from the data signal by amplifying the data signal.

The code G12a illustrates an example of the waveform of the data signal output from the limiting amplifier 51. The limiting amplifier 51 removes a domain (see a dotted line) having a higher voltage than an upper limit value L from the data signal. The upper limit value L is set to a voltage having the highest density distribution of the voltage corresponding to the data value "1" of the main signal data, for example. That is, the upper limit value L is the voltage corresponding to the data value "1" of the main signal data.

Since the voltage of the control data superimposed on the main signal data exceeds the upper limit value L, the control data is removed by the amplification of the limiting amplifier 51. For this reason, the range of the density distribution of the voltage corresponding to the data value "1" of the main signal data is narrower than that of the code G2 illustrated in FIG. 2, and the eye pattern is improved. The data signal output from the limiting amplifier 51 is input to the main signal data detector 52.

The main signal data detector 52 is a first detector, and detects the main signal data from the data signal amplified by the limiting amplifier 51. Since the control data is not included in the data signal, the eye pattern is improved compared with the comparative example. Therefore, in the main signal data detector 52, the data error is reduced compared with the main signal data detector 42 of the comparative example.

The code G13 illustrates an example of the determination state of the data value based on the threshold value TH by the main signal data detector 52. The main signal data detector 52 detects the main signal data by comparing the level of the data signal with the given threshold value TH. For this reason, the eye pattern is improved by the limiting amplifier 51, and hence the main signal data detector 52 can determine the data value with high accuracy.

Moreover, the data signal output from the limiting amplifier 51 is also input to the low pass filter 43. The low pass filter 43 filters the data signal and outputs the filtered data signal to the comparison circuit 45. Here, the data signal output from the main signal data detector 52 as substitute for the limiting amplifier 51 may be input to the low pass filter 43.

Moreover, the linear amplifier 41 amplifies the data signal according to the linear amplification characteristic and outputs the amplified data signal to the low pass filter 44. The code G12b illustrates the waveform of the data signal amplified by the low pass filter 44. The data signal output from the linear amplifier 41 is input to the low pass filter 44. The low pass filter 44 filters the data signal and outputs the filtered data signal to the comparison circuit 45. The comparison circuit 45 outputs the data signal generated as a comparison result to the control data detector 46.

The control data detector 46 detects the control data from the data signal input from the comparison circuit 45. The control data detector 46 detects the control data by detecting the mountain-type waveform domain from the waveform indicated by the code G5, for example. In this example, the waveform of the code G5 is acquired from the comparison of the data signal amplified by the linear amplifier 41 and the data signal amplified by the limiting amplifier 51.

That is, the control data detector 46 detects the control data based on the data signal amplified by the linear amplifier 41 and the data signal amplified by the limiting amplifier 51. The control data detector 46 outputs the control data to the controller 10. Here, the control data detector 46 is an example of a second detector.

Thus, in the user side device 1, the limiting amplifier 51 amplifies one of the data signals branched by the current mirror circuit 50 to remove the control signal as the superimposed signal from the data signal, and the main signal data detector 52 detects the main signal data. Moreover, in the user side device 1, the linear amplifier 41 amplifies another one of the data signals branched by the current mirror circuit 50, and the control data detector 46 detects the control data. Therefore, according to the user side device 1, errors of the main signal data detected from the data signal on which the control data is superimposed are reduced.

Figure 5:
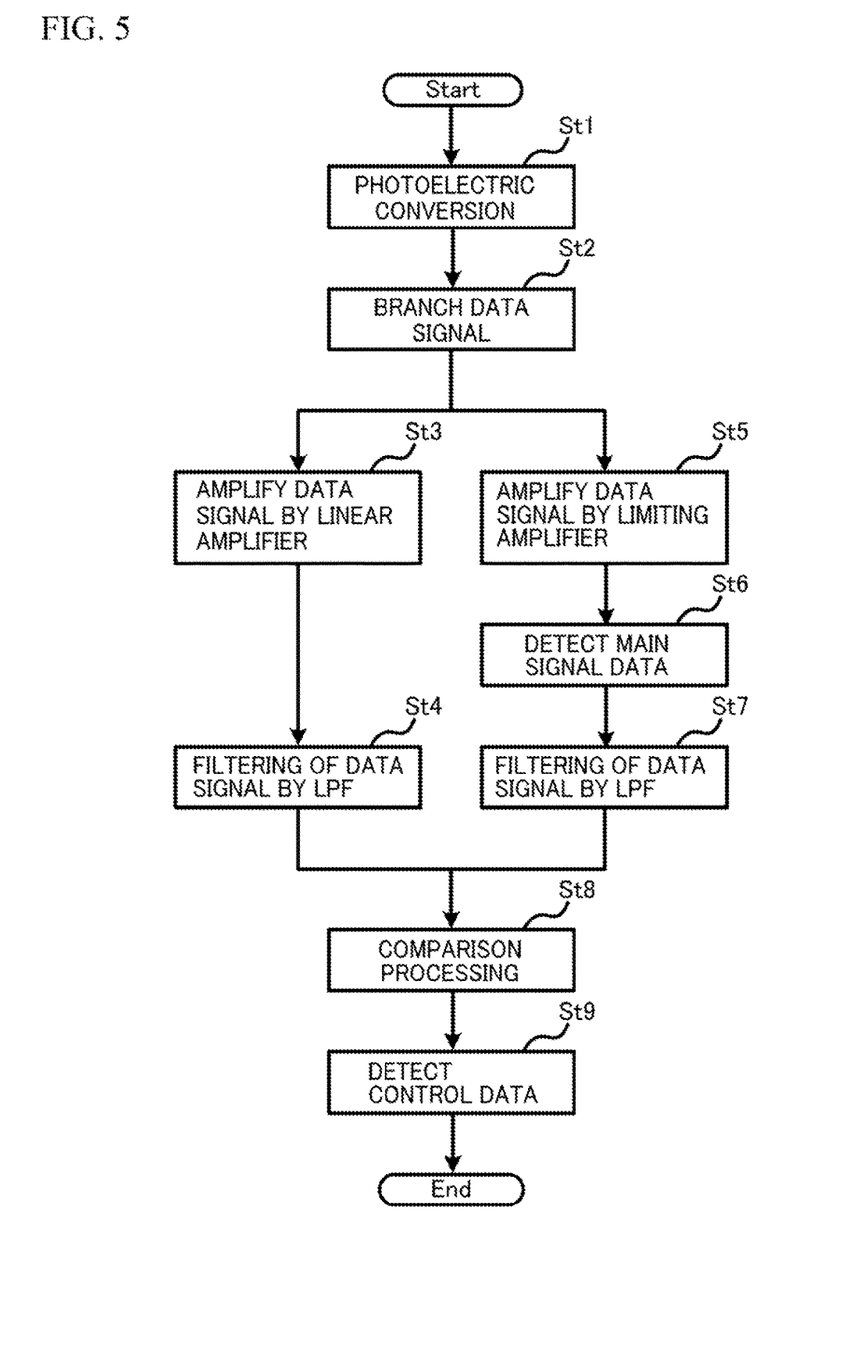
FIG. 5 is a flowchart illustrating an example of a data detection method.

FIG. 5 is a flowchart illustrating an example of a data detection method. The data detection method of the present embodiment is executed by the receiver 14 illustrated in FIG. 4.

First, the PD 40 photoelectrically converts the optical signal (step St1). Next, the current mirror circuit 50 branches the data signal (step St2). Each processing of steps St3 and St4 is performed on one of the data signals branched by the current mirror circuit 50, and concurrently with the above-mentioned processing, each processing of steps ST5 to St7 is performed on another one of the data signals.

The linear amplifier 41 amplifies the one of the data signals (step St3). Next, the low pass filter 44 filters the data signal amplified by the linear amplifier 41 (step St4).

Moreover, the limiting amplifier 51 amplifies the another one of the data signals (step St5). Thereby, the control data is removed from the data signal.

Next, the main signal data detector 52 detects the main signal data from the data signal amplified by the limiting amplifier 51 (step St6). At this time, since the control signal is not included in the data signal, the eye pattern does not deteriorate and the data error at the time of the detection is reduced. Moreover, the main signal data detector 52 detects the main signal data by comparing the level of the data signal with the given threshold value TH. For this reason, the main signal data detector 52 can detect the main signal data from the improved eye pattern with high accuracy.

Next, the low pass filter 43 filters the data signal amplified by the limiting amplifier 51 (step St7). Here, the processing of step St7 may be carried out before the processing of step St6.

Next, the comparison circuit 45 compares the data signal input from the low pass filter 44 with the data signal input from the low pass filter 43 (step St8). Thereby, the mountain-type waveform domain (see the code P4 of FIG. 2) caused by the inter-code interference is removed from the data signal.

Next, the control data detector 46 detects the control data from the data signal amplified by the linear amplifier 41 and the data signal amplified by the limiting amplifier 51 (step St9). In this case, since the mountain-type waveform domain is not included in the data signal, the control data is normally detected. In this way, the data detection method is performed.

In the above-mentioned embodiment, the data signal is electrically branched by the current mirror circuit 50. However, the data signal may be optically branched by an optical splitter, for example, as described in the following embodiment.

Figure 6:
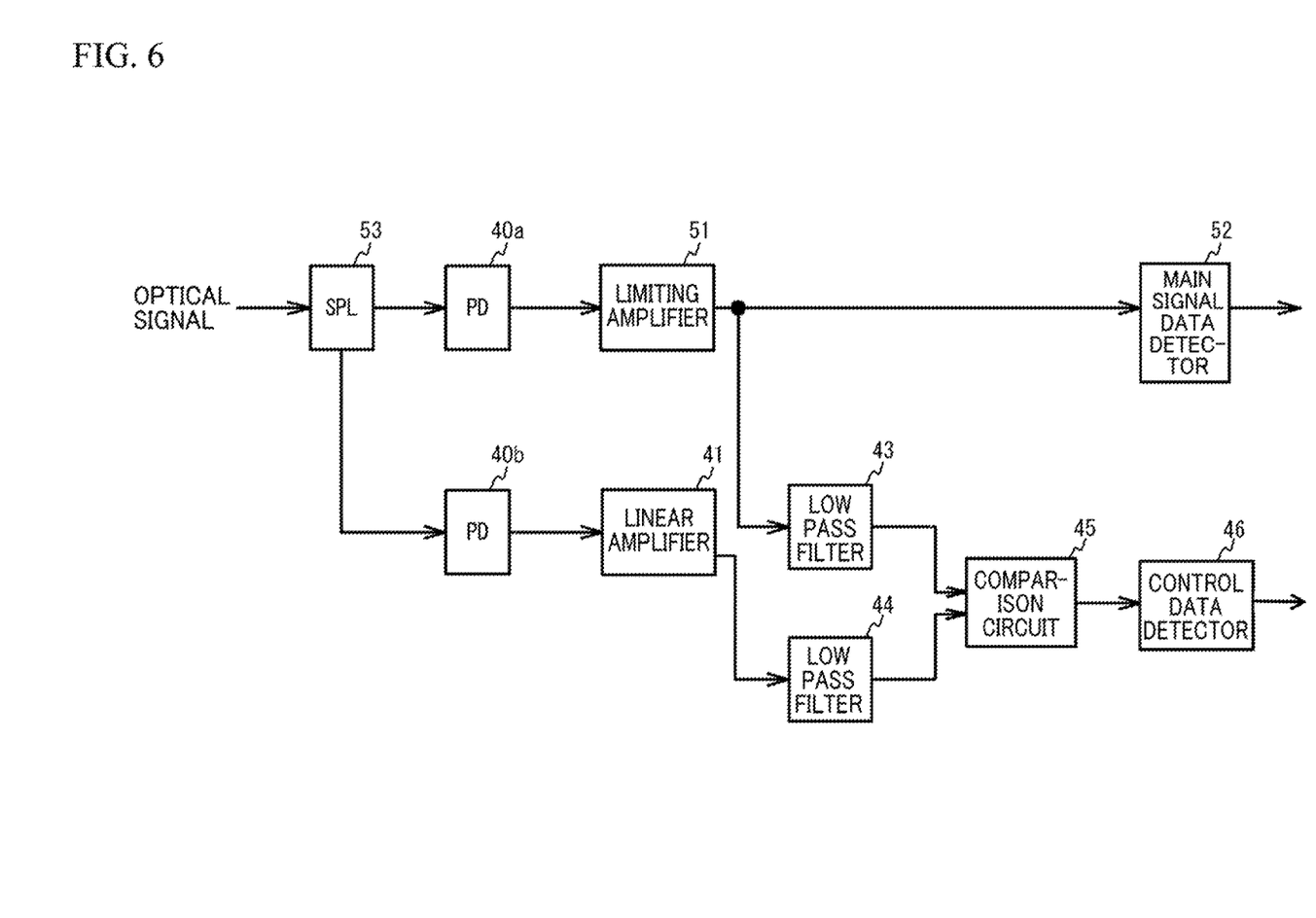
FIG. 6 is a configuration diagram illustrating the receiver according to another embodiment.

FIG. 6 is a configuration diagram illustrating the receiver 14 according to another embodiment. In FIG. 6, elements common to those in FIG. 4 are designated by the same reference numbers, and description thereof is omitted.

The receiver 14 includes an optical splitter 53, PDs 40a and 40b, the linear amplifier 41, the limiting amplifier 51, the main signal data detector 52, the low pass filters 43 and 44, the comparison circuit 45 and the control data detector 46. The optical splitter 53 is another example of the branch circuit, and branches the data signal before the photoelectric conversion by the PDs 40a and 40b, i.e., branches the optical signal. One of the branched optical signals is input to the PD 40a, and another one of the branched optical signals is input to the PD 40b.

The PD 40a converts the optical signal input from the optical splitter 53 to an electric signal, and outputs the electric signal to the limiting amplifier 51 as the data signal. Moreover, the PD 40b converts the optical signal input from the optical splitter 53 to the electric signal, and outputs the electric signal to the linear amplifier 41 as the data signal. Here, since the PD 40b photoelectrically converts the data signal for detecting the control data having a lower rate than the main signal data, the PD 40b having a lower processing rate than the PD 40a may be used.

Thus, in the present embodiment, the optical splitter 53 branches the data signal at the stage of the optical signal as substitute for the current mirror circuit 50. For this reason, a noise caused by the branch of the data signal is suppressed compared with the case of using the current mirror circuit 50 as the branch circuit. On the contrary, when the current mirror circuit 50 is used as the branch circuit as illustrated in FIG. 4, there is no need to use the two PDs 40a and 40b and hence it is possible to reduce a circuit scale compared with this embodiment.

Figure 7:
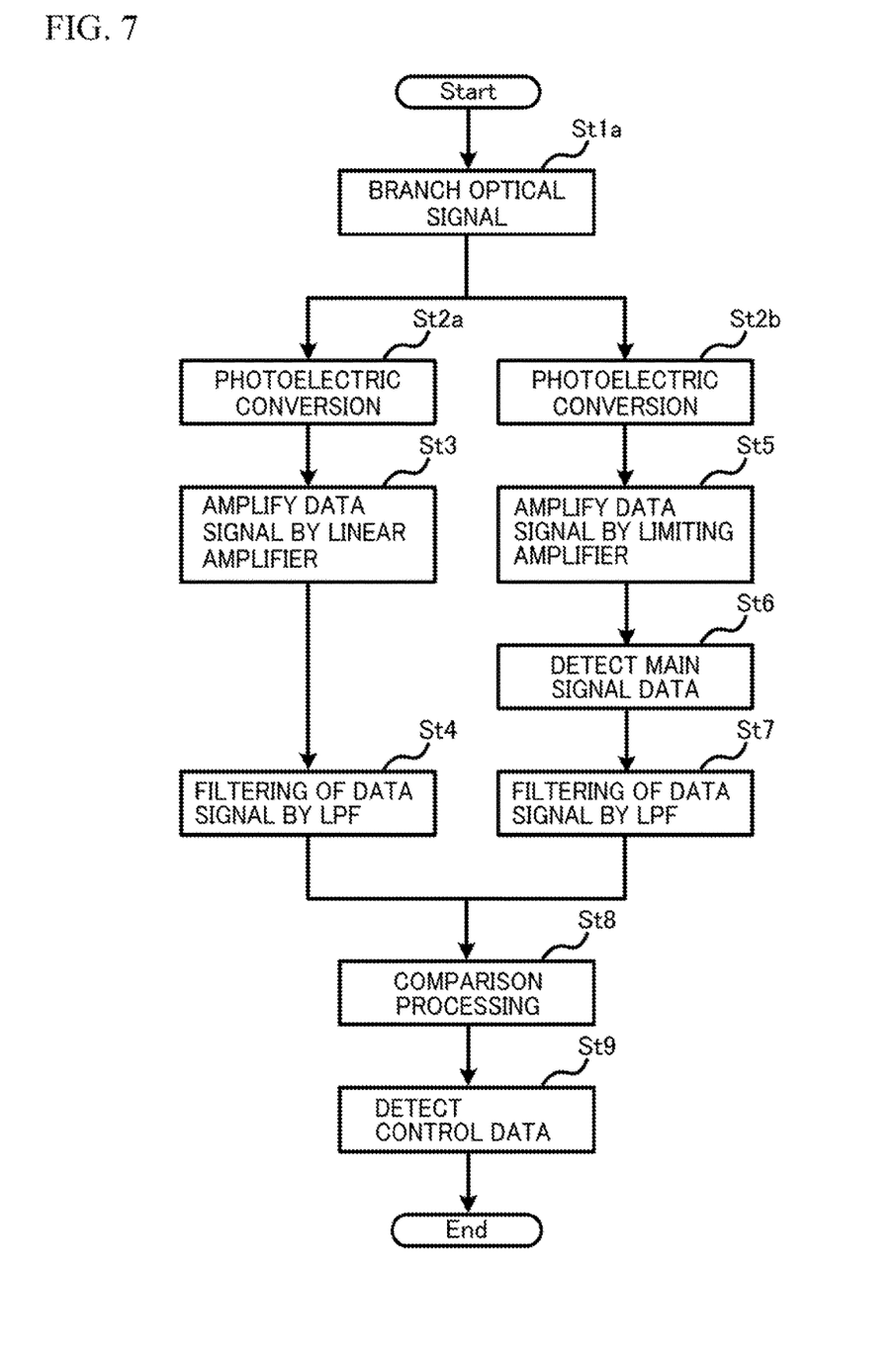
FIG. 7 is a flowchart illustrating another example of the data detection method.

FIG. 7 is a flowchart illustrating another example of the data detection method. The data detection method in this embodiment is executed by the receiver 14 illustrated in FIG. 6. In FIG. 7, elements common to those in FIG. 5 are designated by the same reference numbers, and description thereof is omitted.

First, the optical splitter 53 branches the optical signal (step St1a). Each processing of steps St2a, St3 and St4 is performed on one of the optical signals (the data signals) branched by the optical splitter 53, and concurrently with the above-mentioned processing, each processing of steps ST2b and St5 to St7 is performed on another one of the optical signals (the data signals).

The PD 40a photoelectrically converts the one of the optical signals (step St2a). Then, each processing of steps St3 and St4 is performed on the data signal output from the PD 40a.

Moreover, the PD 40b photoelectrically converts the another one of the optical signals (step St2b). Then, each processing of steps St5 to St7 is performed on the data signal output from the PD 40b. In this way, the data detection method is performed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A transmission apparatus comprising:
   a branch circuit that branches a signal including first data and second data superimposed on the first data into two signals, the signal having an amplitude larger in domains in which the second data is superimposed on the first data than that in other domains;
   a limiting amplifier that amplifies first one signal of the two signals;
   a linear amplifier that amplifies second one signal of the two signals;
   a first detector that detects the first data from the first one signal amplified by the limiting amplifier; and
   a second detector that detects the second data from the second one signal amplified by the linear amplifier and the first one signal amplified by the limiting amplifier,
   wherein the limiting amplifier limits an amplitude of the first one signal to remove the second data from the first one signal.

2. The transmission apparatus as claimed in claim 1, wherein
   the first detector detects the first data by comparing a level of the first one signal with a given threshold value.

3. The transmission apparatus as claimed in claim 1, wherein
   the branch circuit is a current mirror circuit.

4. The transmission apparatus as claimed in claim 1, wherein
   the branch circuit is an optical splitter.

5. A transmission system comprising:
   a first transmission apparatus that transmits a signal including first data and second data superimposed on the first data, the signal having an amplitude larger in domains in which the second data is superimposed on the first data than that in other domains; and
   a second transmission apparatus that receives the signal from the first transmission apparatus;
   the second transmission apparatus including:
   a branch circuit that branches the signal into two signals;
   a limiting amplifier that amplifies first one signal of the two signals;
   a linear amplifier that amplifies second one signal of the two signals;
   a first detector that detects the first data from the first one signal amplified by the limiting amplifier; and
   a second detector that detects the second data from the second one signal amplified by the linear amplifier and the first one signal amplified by the limiting amplifier, wherein the limiting amplifier limits an amplitude of the first one signal to remove the second data from the first one signal.

6. The transmission system as claimed in claim 5, wherein the first detector detects the first data by comparing a level of the first one signal with a given threshold value.

7. The transmission system as claimed in claim 5, wherein the branch circuit is a current mirror circuit.

8. The transmission system as claimed in claim 5, wherein the branch circuit is an optical splitter.

9. A data detection method implemented by a transmission apparatus, comprising:
   branching, by a branch circuit, a signal including first data and second data superimposed on the first data into two signals, the signal having an amplitude larger in domains in which the second data is superimposed on the first data than that in other domains;
   amplifying, by a limiting amplifier, first one signal of the two signals;
   amplifying, by a linear amplifier, second one signal of the two signal;
   detecting, by a first detector, the first data from the first one signal amplified by the limiting amplifier; and
   detecting, by a second detector, the second data from the second one signal amplified by the linear amplifier and the first one signal amplified by the limiting amplifier,
   wherein the limiting amplifier limits an amplitude of the first one signal to remove the second data from the first one signal.

10. The data detection method as claimed in claim 9, wherein
    the detecting the first data detects the first data by comparing a level of the first one signal with a given threshold value.

11. The data detection method as claimed in claim 9, wherein
    the branching branches the signal by a current mirror circuit.

12. The data detection method as claimed in claim 9, wherein
    the branching branches the signal by an optical splitter.

* * * * *